United States Patent
Liu et al.

(10) Patent No.: US 9,086,450 B2
(45) Date of Patent: Jul. 21, 2015

(54) METHOD FOR MEASURING CAPACITANCES OF CAPACITORS

(75) Inventors: Min-Tar Liu, Jhubei (TW);
Chih-Chiang Chang, Taipei (TW);
Chu-Fu Chen, Zhubei (TW);
Ping-Hsiang Huang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 950 days.

(21) Appl. No.: 12/897,150

(22) Filed: Oct. 4, 2010

(65) Prior Publication Data
US 2012/0084033 A1 Apr. 5, 2012

(51) Int. Cl.
*G01R 27/26* (2006.01)
*G01R 31/28* (2006.01)
*H03K 17/96* (2006.01)

(52) U.S. Cl.
CPC ........ *G01R 31/2884* (2013.01); *G01R 27/2605* (2013.01); *H03K 17/962* (2013.01)

(58) Field of Classification Search
USPC .......................................... 324/368
See application file for complete search history.

(56) References Cited

U.S. PATENT DOCUMENTS

| | | | |
|---|---|---|---|
| 4,709,225 A * | 11/1987 | Welland et al. | 341/121 |
| 6,404,222 B1 | 6/2002 | Fan et al. | |
| 6,549,029 B1 * | 4/2003 | Hsieh et al. | 324/750.01 |
| 6,737,870 B2 | 5/2004 | Okagaki et al. | |
| 7,129,696 B2 | 10/2006 | Savithri | |
| 2003/0218473 A1 * | 11/2003 | Yamashita et al. | 324/765 |

FOREIGN PATENT DOCUMENTS

CN 1421703 A 6/2003
TW 464764 B 11/2001

* cited by examiner

*Primary Examiner* — Melissa Koval
*Assistant Examiner* — Stephen G Armstrong
(74) *Attorney, Agent, or Firm* — Slater & Matsil, L.L.P.

(57) ABSTRACT

A capacitor measurement circuit for measuring a capacitance of a test capacitor includes a first transistor with a first source-drain path coupled between a first capacitor plate of the test capacitor and a ground; a second transistor with a second source-drain path coupled between a second capacitor plate of the test capacitor and the ground; and a current-measuring device configured to measure a first charging current and a second charging current of the test capacitors. The first and the second charging currents flow to the test capacitor in opposite directions.

19 Claims, 3 Drawing Sheets

METHOD FOR MEASURING CAPACITANCES OF CAPACITORS

BACKGROUND

Technical Field

The present disclosure is related generally to integrated circuits, and more specifically to the circuits for measuring capacitance values of capacitors in integrated circuits.

Charge based capacitance measurement (CBCM) is a well known method for measuring capacitances of capacitors in integrated circuits. In integrated circuits, the metal connection of a to-be-measured capacitor results in a parasitic capacitance, which may adversely affect the measurement result of the to-be-measured capacitor. To obtain the correct capacitance of the to-be-measured capacitor, the parasitic capacitance needs to be removed from the measured capacitance.

In the CBCM schemes, a dummy connection is formed to match the routing of the to-be-measured capacitor. As a result, the parasitic capacitance of the dummy connection is expected to match the parasitic capacitance of the metal connection of the to-be-measured capacitor. Two measurement steps are performed. In the first measurement step, a first plurality of charging-and-discharging cycles is performed to charge and discharge the dummy connection, and a first average current for charging the dummy connection is obtained. The first average current reflects the parasitic capacitance of the dummy connection. In the second measurement step, a second plurality of charging-and-discharging cycles is performed to charge and discharge the to-be-measured capacitor along with the parasitic capacitor of the metal connection, and a second average current for charging the to-be-measured capacitor is obtained. The second average current reflects the parasitic capacitance of the to-be-measured capacitor and the parasitic capacitance of the metal connection. By subtracting the first average current from the second average current, a third average current for charging the to-be-measured capacitor alone may be calculated. Since the effect of the parasitic capacitance of the metal connection has been cancelled from the third average current, the correct capacitance of the to-be-measured capacitor may thus be calculated.

The conventional CBCM schemes suffer from drawbacks. In order to cancel the parasitic capacitance of the metal connection, the dummy connection needs to match the metal connection of the to-be-measured capacitor accurately. This is difficult to achieve due to process variations. Further, in the case when a plurality of to-be-measured capacitors, such as the capacitors in a capacitor array, needs to be measured, the routing of the respective connection is complex, and hence it is very difficult to form dummy connections matching the metal connections.

BRIEF SUMMARY

The present disclosure provides embodiments of mechanisms of measuring the capacitance values of the capacitors in integrated circuits. In accordance with some embodiments of the present disclosure, charging currents are provided to charge a test capacitor in opposite directions. The average charging current flowing in each of the directions is obtained, and is used to calculate the capacitance value of the test capacitor.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method of measuring the capacitance of a test capacitor is provided in accordance with an embodiment. The variations and the operation of the embodiment are discussed. Throughout the various views and illustrative embodiments, like reference numbers are used to designate like elements.

Figure 1:
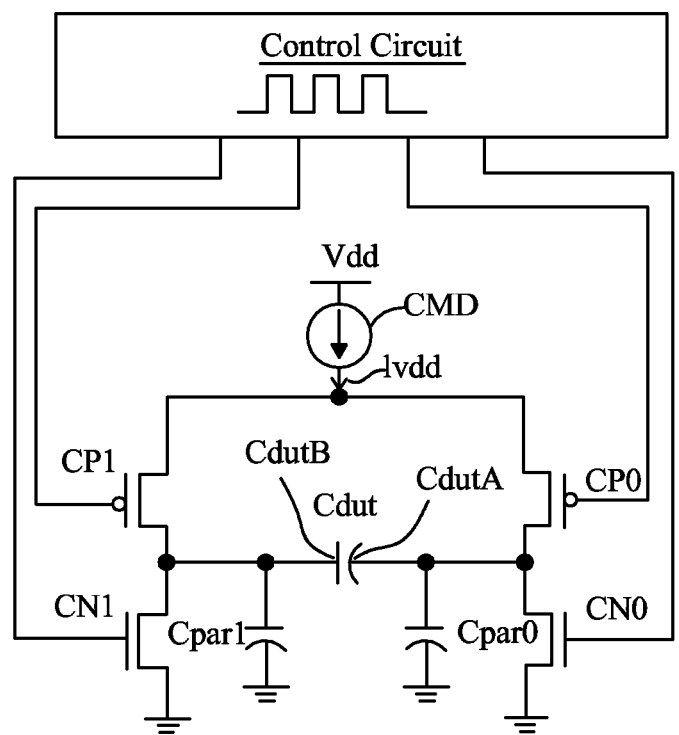
FIG. 1 illustrates a circuit diagram of a test circuit for measuring a capacitance of a test capacitor.

FIG. 1 illustrates a circuit diagram in accordance with an embodiment. PMOS transistor CP0 is coupled to NMOS transistor CN0, with their drains coupled to each other. The source of NMOS transistor CN0 may be grounded. PMOS transistor CP1 is coupled to NMOS transistor CN1, with their drains coupled to each other. The source of NMOS transistor CN1 may be grounded. Power supply voltage node Vdd, which carriers a positive power supply voltage (also denoted as Vdd), is provided. The sources of PMOS transistors CP1 and CP0 are coupled to power supply voltage node Vdd through current-measuring device CMD, which is capable of measuring the current Ivdd flowing through itself. In an embodiment, current-measuring device CMD is able to display the waveform of the current flowing through it. Current Ivdd may be an average current of a plurality of current-charging cycles, which average current may be obtained from the waveform of the current flowing through current-measuring device CMD. The gates of PMOS transistors CP0 and CP1 and NMOS transistors CN0 and CN1 are coupled to, and controlled by, a control circuit.

The drains of transistors CP0 and CN0 are coupled to a first capacitor plate CdutA of test capacitor Cdut, whose capacitance Cdut is to be measured. The source-drain path of NMOS transistor CN0 is electrically coupled between the ground and first capacitor plate CdutA. The drains of transistors CP1 and CN1 are coupled to a second capacitor plate CdutB of test capacitor Cdut. The source-drain path of NMOS transistor CN1 is electrically coupled between the ground and second capacitor plate CdutB. The parasitic capacitor that may be observed at first capacitor plate CdutA is represented by capacitor Cpar0 (with the capacitance also represented as Cpar0), and the parasitic capacitor that may be observed at the second capacitor plate Cdut B is represented using capacitor Cpar1 (with the capacitance represented as Cpar1).

The measurement of capacitance Cdut includes three steps, which can be performed in any order. In the first measurement step, the control circuit applies logic-high signals to the gate of NMOS transistor CN1 and the gate of PMOS transistor CP1. Accordingly, PMOS transistor CP1 is turned off, and NMOS transistor CN1 is turned on. Parasitic capacitor Cpar1 is thus shorted to the ground by NMOS transistor CN1, and parasitic capacitor Cpar1 will not be charged in the first measurement step. The control circuit further provides non-overlay clock-cycle signals to the gates of CP0 and CN0, which means that at most one of PMOS transistor CP0 and NMOS transistor CN0 is turned on at any time wherein the non-overlay clock-cycle signals are applied. PMOS transistor CP0 is turned on and NMOS transistor CN0 is turned off by logic-low gate signals, whose edges may be slightly offset from each other. The logic-low signals are parts of the non-overlay signals. With the non-overlay clock-cycle signal applied to the gates of PMOS transistor CP0 and NMOS transistor CN0, capacitors Cdut and Cpar0 are charged by power supply voltage Vdd. When PMOS transistor CP0 is turned off and NMOS transistor CN0 is turned on by logic-high signals, which are parts of the non-overlay clock-cycle signals, capacitors Cdut and Cpar0 are discharged. A plurality of charge-discharging cycles may be performed by applying non-overlay clock-cycle signals to the gates of PMOS transistor CP0 and NMOS transistor CN0, and an average charging current Ivdd0 may be obtained/measured by current-measuring device CMD. With the non-overlay clock-cycle signals having frequency f, the following relationship exists:

$$Ivdd0 = (Cpar0 + Cdut) \times Vdd \times f \quad [\text{Eq. 1}]$$

In the second measurement step, the control circuit applies non-overlay logic-high signals to the gate of PMOS transistor CP0 and the gate of NMOS transistor CN0. Accordingly, PMOS transistor CP0 is turned off, and NMOS transistor CN0 is turned on. Parasitic capacitor Cpar0 is thus shorted to the ground by NMOS transistor CN0, and parasitic capacitor Cpar0 will not be charged in the second measurement step. Similar to the first measurement step, the control circuit further provides non-overlay clock-cycle signals to the gates of transistors CP1 and CN1, and perform charging-discharging cycles on capacitors Cdut and Cpar1. When PMOS transistor CP1 is turned off and NMOS transistor CN1 is turned on, capacitors Cdut and Cpar1 are discharged. When PMOS transistor CP1 is turned on and NMOS transistor CN1 is turned off, capacitors Cdut and Cpar0 are charged. A plurality of charge-discharging cycles may be performed, and an average charging current Ivdd1 may be obtained/measured by current-measuring device CMD. Charging currents Ivdd0 and Ivdd1 flow to test capacitor Cdut in opposite directions. When the non-overlay clock-cycle signals has frequency f, the following relationship exists:

$$Ivdd1 = (Cpar1 + Cdut) \times Vdd \times f \quad [\text{Eq. 2}]$$

In the third measurement step, the gates of PMOS transistors CP0 and CP1 are applied with a same control signal, and hence are turned on and off simultaneously. The gates of NMOS transistors CN0 and CN1 are applied with a same control signal, and hence are turned on and off simultaneously. Accordingly, the two capacitor plates CdutA and CdutB of test capacitor Cdut are always at substantially a same voltage (which is higher than a ground voltage), and hence test capacitor Cdut is not charged in the third measurement step. The control circuit further provides non-overlay clock-cycle signals to the gates of PMOS transistors CP0/CP1 and the gates of NMOS transistors CN0/CN1, so that charging-discharging cycles are performed on parasitic capacitors Cpar0 and Cpar1 simultaneously. When PMOS transistors CP0 and CP1 are turned off and NMOS transistors CN0 and CN1 are turned on, parasitic capacitors Cpar0 and Cpar1 are discharged. When PMOS transistors CP0 and CP1 are turned on and NMOS transistors CN0 and CN1 are turned off, capacitors Cpar0 and Cpar1 are charged. A plurality of charge-discharging cycles may be performed, and an average charging current Ivdd2 may be obtained from current-measuring device CMD. With the non-overlay clock-cycle signals having frequency f, following relationship exists:

$$Ivdd2 = (Cpar0 + Cpar1) \times Vdd \times f \quad [\text{Eq. 3}]$$

Next, a calculation is performed using expression (Eq. 1+Eq. 2−Eq. 3), which means adding up the left-side items of equations 1 and 2 to generating a sum, and subtracting the left-side item of equation 3 from the sum. The resulting value will be equal to the result obtained by adding up the right-side items of equations 1 and 2, and subtracting the right-side item of equation 3. The resulting equation is:

$$Ivdd0 + Ivdd1 - Ivdd2 = 2Cdut \times Vdd \times f \quad [\text{Eq. 4}]$$

From Eq. 4, capacitance Cdut may be calculated as:

$$Cdut = (Ivdd0 + Ivdd1 - Ivdd2)/(2 \times Vdd \times f) \quad [\text{Eq. 5}]$$

Through the above-described steps, parasitic capacitances Cpar1 and Cpar0 are cancelled, and capacitance Cdut of test capacitor Cdut is obtained.

Figure 2:
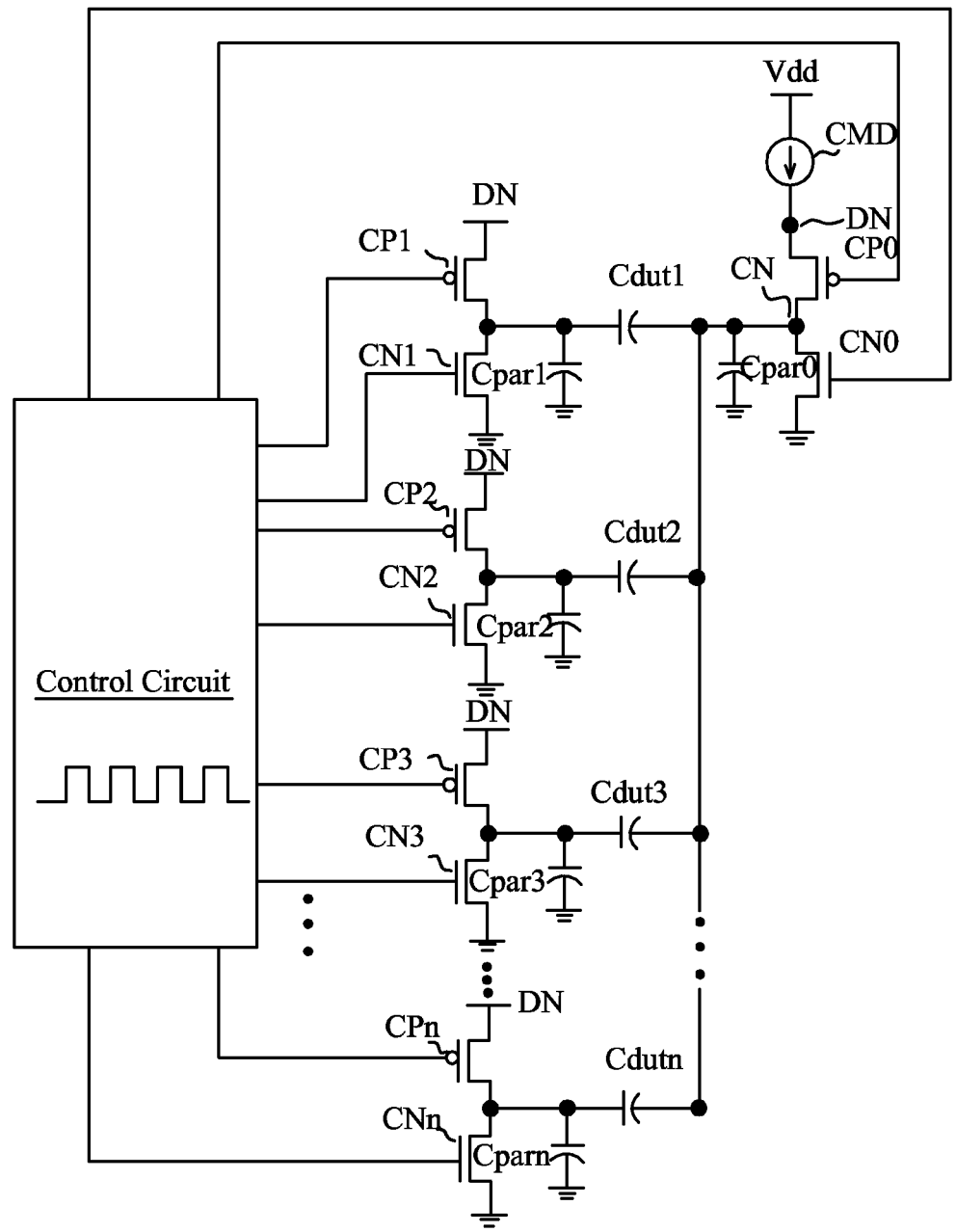
FIG. 2 illustrates a circuit diagram of a test circuit for measuring capacitances of a plurality of test capacitors.
Figure 3:
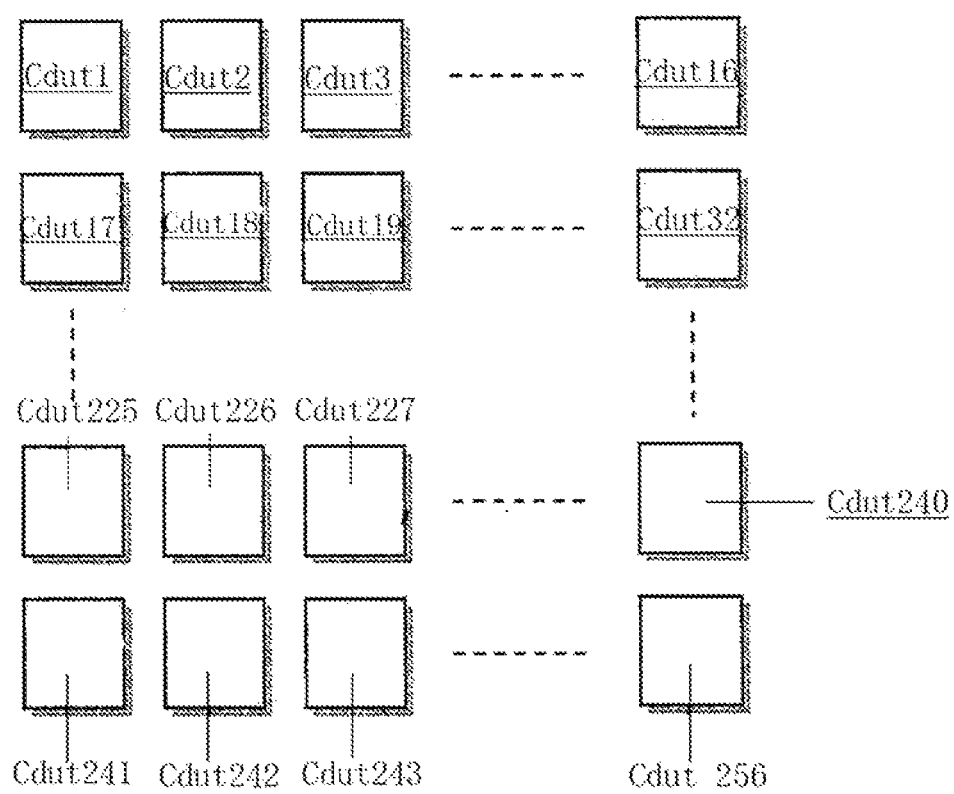
FIG. 3 illustrates a capacitor array formed of the test capacitors.

FIG. 2 illustrates the circuit diagram for measuring capacitances of a plurality of test capacitors Cdut including capacitors Cdut1 through Cdutn, with n being an integer, for example, greater than or equal to 4. In an exemplary embodiment, the plurality of test capacitors Cdut1 through Cdutn may be arranged as an array as shown in FIG. 3, which illustrates a capacitor array having 16×16, or 256, capacitors. PMOS transistor CP0 is coupled to NMOS transistor CN0, with their drains coupled to each other, and to a common node CN. The source of NMOS transistor CN0 may be grounded. PMOS transistor CP0 and NMOS transistor CN0 are shared by the plurality of test capacitors Cdut1 through Cdutn. The connection of PMOS transistor CP1, NMOS transistor CN1, and capacitor Cdut1 is essentially the same as shown in FIG. 1. Each of additional test capacitors Cdut2 through Cdutn is coupled to an addition pair of PMOS and NMOS transistors, wherein the additional test capacitors and the respective PMOS/NMOS transistor pairs (referred to as units hereinafter) may be coupled to common node CN in essentially the same way as that of PMOS transistor CP1, NMOS transistor CN1, and capacitor Cdut1. The sources of PMOS transistors CP0, CP1, CP2 . . . may be coupled to node DN, which is further coupled to power supply voltage node Vdd through current-measuring device CMD. Again, a control circuit is coupled to the gates of PMOS transistors P0 through Pn and the gates of NMOS transistors P0 through Pn.

In the following description, the measurement of capacitance Cdut1 is described, and one skilled in the art will able to understand the measurement of the capacitances of test capacitors Cdut2 through Cdutn. In the first measurement step, the control circuit provides non-overlay logic-high signals to the gates of PMOS transistors CP1 through CPn and the gates of NMOS transistors CN1 through CNn. Accordingly, all of NMOS transistors CN1 through CNn are turned on, and hence parasitic capacitors Cpar1 through Cparn are all shorted to ground. Non-overlay clock-cycle signals with frequency f are then provided to the gates of transistors CP0 and CN0, so that the average current flowing through current-measuring device CMD and for charging parasitic capacitor Cpar0 is measured, and an equation is derived similar to deriving Eq. 1.

In the second measurement step, the control circuit provides a logic-high signal to the gates of PMOS transistors CP0 and CP2 through CPn and the gates of NMOS transistors CN0 and CN2 through CNn. Accordingly, all of NMOS transistors CN0 and CN2 through CNn are turned on, and hence parasitic capacitors Cpar0 and Cpar2 through Cparn are all shorted to ground. A non-overlay clock-cycle signal with frequency f is then provided to the gates of transistors CP1 and CN1, so that the average current flowing through current-measuring device CMD and for charging parasitic capacitor Cpar1 is measured, and an equation is derived similar to deriving Eq. 2.

In the third measurement step, the control circuit provides non-overlay logic-high signals to the gates of PMOS transistors CP2 through CPn and the gates of NMOS transistors CN2 through CNn. Accordingly, all of NMOS transistors CN0 and CN2 through CNn are turned on, and hence parasitic capacitors Cpar2 through Cparn are all shorted to the ground. Non-overlay clock-cycle signals with frequency f are then provided to the gates of transistors CP0, CP1, CN0 and CN1, with the same signal applied to the gates of transistors CP0 and CP1 simultaneously, and the same signal applied to the gates of transistors CN0 and CN1 simultaneously. As a result, the average current flowing through current-measuring device CMD and for charging parasitic capacitors Cpar0 and Cpar1 is measured, and an equation similar to what is shown Eq. 3 is obtained. The capacitance Cdut1 can then be calculated using the similar calculation steps as shown in FIGS. 4 and 5. The above-recited second and third measurement steps may be repeated for each of the capacitors Cdut2 through Cdutn, and capacitances Cdut2 through Cdutn may also be calculated.

In the embodiments, no dummy connection needs to be formed to match the connections of the test capacitors. Accordingly, the measurement is much easier than in the conventional charge based capacitance measurement (CBCM) schemes. Further, when a plurality of test capacitors such as an array of test capacitors is involved, the save of the effort in the layout of the dummy connections is significant.

In accordance with embodiments, a capacitor measurement circuit for measuring a capacitance of a test capacitor includes a first transistor with a first source-drain path coupled between a first capacitor plate of the test capacitor and a ground; a second transistor with a second source-drain path coupled between a second capacitor plate of the test capacitor and the ground; and a current-measuring device configured to measure a first charging current and a second charging current of the test capacitors. The first and the second charging currents flow to the test capacitor in opposite directions.

In accordance with alternative embodiments, a capacitor measurement circuit for measuring a capacitance of a test capacitor includes a power supply voltage node; a current-measuring device coupled to the power supply voltage node; a first PMOS transistor comprising a source coupled to the current-measuring device, and a drain coupled to a first capacitor plate of the test capacitor; a first NMOS transistor comprising a source coupled to a ground, and a drain coupled to the first capacitor plate of the test capacitor; a second PMOS transistor comprising a source coupled to the current-measuring device, and a drain coupled to a second capacitor plate of the test capacitor; and a second NMOS transistor comprising a source coupled to the ground, and a drain coupled to the second capacitor plate of the test capacitor.

In accordance with yet other embodiments, a capacitor measurement circuit includes a power supply voltage node; a current-measuring device coupled to the power supply voltage node; a first PMOS transistor comprising a source coupled to the current-measuring device, and a drain coupled to a common node; a first NMOS transistor comprising a source coupled to a ground, and a drain coupled to the common node; a plurality of test capacitors, each comprising a first capacitor plate coupled to the common node, and a second capacitor plate; a plurality of second PMOS transistors, each comprising a source coupled to the current-measuring device, and a drain coupled to the second capacitor plate of one of the plurality of test capacitors; and a plurality of second NMOS transistors, each comprising a source coupled to the ground, and a drain coupled to the second capacitor plate of the one of the plurality of test capacitors.

In accordance with yet other embodiments, a method of measuring a capacitance of a test capacitor includes performing a first charging on the test capacitor, wherein a first parasitic capacitor coupled to the test capacitor is charged along with the test capacitor, and a second parasitic capacitor coupled to the test capacitor is not charged along with the test capacitor, and wherein the first and the second parasitic capacitors are coupled to opposite capacitor plates of the test capacitor; measuring a first average current for the first charging; performing a second charging on the test capacitor, wherein the second parasitic capacitor is charged along with the test capacitor, and the first parasitic capacitor is not charged along with the test capacitor; measuring a second average current for the second charging; performing a third charging on the first and the second parasitic capacitors, wherein the test capacitor is not charged along with the first and the second parasitic capacitors; measuring a third average current for the third charging; and calculating the capacitance of the test capacitor from the first, the second, and the third average currents.

In accordance with yet other embodiments, a method of measuring a capacitance of a test capacitor includes providing a test circuit including a first transistor with a first source-drain path coupled between a first capacitor plate of the test capacitor and a ground; and a second transistor with a second source-drain path coupled between a second capacitor plate of the test capacitor and the ground. The method further includes shorting the first capacitor plate to the ground by turning on the first transistor, and performing a first charging on the test capacitor by turning off the second transistor, wherein a first average current for charging the test capacitor is measured; shorting the second capacitor plate to the ground by turning on the second transistor, and performing a second charging on the test capacitor by turning off the first transistor, wherein a second average current for charging the test capacitor is measured; turning off the first and the second transistors and measuring a third average current for charging parasitic capacitors coupled to the test capacitor; and calculating the capacitance of the test capacitor from the first, the second, and the third average currents.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A capacitor measurement circuit for measuring a capacitance of a test capacitor, the capacitor measurement circuit comprising:
    a first NMOS transistor with a first source-drain path coupled between a first capacitor plate of the test capacitor and a ground;
    a second NMOS transistor with a second source-drain path coupled between a second capacitor plate of the test capacitor and the ground;
    a current-measuring device configured to measure a first charging current and a second charging current of the test capacitor, wherein the first and the second charging currents flow to the test capacitor in opposite directions;
    a first PMOS transistor comprising a source coupled to the current-measuring device, and a drain coupled to a drain of the first NMOS transistor;
    a second PMOS transistor comprising a source coupled to the current-measuring device, and a drain coupled to a drain of the second NMOS transistor; and
    a control circuit configured to provide first non-overlay clock-cycle signals to gates of the first PMOS transistor and the first NMOS transistor, and second non-overlay clock-cycle signals to gates of the second PMOS transistor and the second NMOS transistor, wherein the first non-overlay clock-cycle signals are configured to turn on at most one of the first PMOS transistor and the first NMOS transistor, and the second non-overlay clock-cycle signals are configured to turn on at most one of the second PMOS transistor and the second NMOS transistor.

2. The capacitor measurement circuit of claim 1, wherein the current-measuring device is coupled between a power supply voltage node and the first source-drain path of the first NMOS transistor, and between the power supply voltage node and the second source-drain path of the second NMOS transistor.

3. The capacitor measurement circuit of claim 1, wherein drains of the first and the second NMOS transistors are coupled to opposite capacitor plates of, and separated from each other by, the test capacitor.

4. The capacitor measurement circuit of claim 1 being configured to control the current-measuring device to measure the first charging current and the second charging current of the test capacitor.

5. The capacitor measurement circuit of claim 1, wherein the control circuit is further configured to provide the first non-overlay clock-cycle signals to gates of the first PMOS transistor and the first NMOS transistor, and the second non-overlay clock-cycle signals to gates of the second PMOS transistor and the second NMOS transistor during discharging the test capacitor.

6. A capacitor measurement circuit for measuring a capacitance of a test capacitor, the capacitor measurement circuit comprising:
    a power supply voltage node;
    a current-measuring device coupled to the power supply voltage node, wherein the current-measuring device is configured to measure a first charging current and a second charging current of the test capacitor, with the first and the second charging currents flowing to the test capacitor in opposite directions;
    a first PMOS transistor comprising a source coupled to the current-measuring device, and a drain coupled to a first capacitor plate of the test capacitor;
    a first NMOS transistor comprising a source coupled to a ground, and a drain coupled to the first capacitor plate of the test capacitor;
    a second PMOS transistor comprising a source coupled to the current-measuring device, and a drain coupled to a second capacitor plate of the test capacitor;
    a second NMOS transistor comprising a source coupled to the ground, and a drain coupled to the second capacitor plate of the test capacitor; and
    a control circuit configured to provide first non-overlay clock-cycle signals to gates of the first PMOS transistor and the first NMOS transistor, and second non-overlay clock-cycle signals to gates of the second PMOS transistor and the second NMOS transistor, wherein the first non-overlay clock-cycle signals are configured to turn on at most one of the first PMOS transistor and the first NMOS transistor, and the second non-overlay clock-cycle signals are configured to turn on at most one of the second PMOS transistor and the second NMOS transistor.

7. The capacitor measurement circuit of claim 6, wherein the control circuit is configured to provide logic-high signals to gates of the second PMOS transistor and the second NMOS transistor, when the control circuit provides the first non-overlay clock-cycle signals.

8. The capacitor measurement circuit of claim 6, wherein the control circuit is further configured to:
    provide first additional signals to turn on and turn off the first PMOS transistor and the second PMOS transistor simultaneously; and
    provide second additional signals to turn on and turn off the first NMOS transistor and the second NMOS transistor simultaneously.

9. The capacitor measurement circuit of claim 6 further comprising a plurality of units, each comprising:
    an additional test capacitor comprising a first capacitor plate coupled to the drain of the first NMOS transistor;
    an additional PMOS transistor comprising a source coupled to the current-measuring device, and a drain coupled to a second capacitor plate of the additional test capacitor; and
    an additional NMOS transistor comprising a source coupled to the ground, and a drain coupled to the second capacitor plate of the additional test capacitor.

10. The capacitor measurement circuit of claim 9, wherein the test capacitor and the additional test capacitors of the plurality of units form a capacitor array.

11. The capacitor measurement circuit of claim 9, wherein a count of the plurality of units is greater than three.

12. The capacitor measurement circuit of claim 9, wherein drains of the first and the second NMOS transistors are separated from each other by the test capacitor.

13. The capacitor measurement circuit of claim 6 being configured to control the current-measuring device to measure the first charging current and the second charging current of the test capacitor.

14. The capacitor measurement circuit of claim 6, wherein the control circuit is further configured to provide the first non-overlay clock-cycle signals to gates of the first PMOS transistor and the first NMOS transistor, and the second non-overlay clock-cycle signals to gates of the second PMOS transistor and the second NMOS transistor during discharging the test capacitor.

15. A method of measuring a capacitance of a test capacitor, the method comprising:
applying non-overlay clock-cycle signals to gates of a first PMOS transistor and a first NMOS transistor, with one end of the test capacitor connected to drains of the first PMOS transistor and the first NMOS transistor, wherein the non-overlay clock-cycle signals are configured to turn on at most one of the first PMOS transistor and the first NMOS transistor;
performing a first charging on the test capacitor coupled to the first PMOS transistor and the first NMOS transistor, wherein a first parasitic capacitor coupled to the test capacitor is charged along with the test capacitor, and a second parasitic capacitor coupled to the test capacitor is not charged along with the test capacitor, and wherein the first and the second parasitic capacitors are coupled to opposite capacitor plates of the test capacitor, and in the first charging, a charging current flows through the test capacitor in a first direction;
measuring a first average charging current for the first charging;
performing a second charging on the test capacitor, wherein the second parasitic capacitor is charged along with the test capacitor, and the first parasitic capacitor is not charged along with the test capacitor, and in the second charging, a charging current flows through the test capacitor in a second direction opposite to the first direction;
measuring a second average charging current for the second charging;
performing a third charging on the first and the second parasitic capacitors, wherein the test capacitor is not charged along with the first and the second parasitic capacitors;
measuring a third average charging current for the third charging; and
calculating the capacitance of the test capacitor from the first, the second, and the third average charging currents.

16. The method of claim 15, wherein each of the steps of performing the first charging, the second charging, and the third charging comprises a plurality of charging-discharging cycles performed in a plurality of clock cycles.

17. The method of claim 16, wherein the capacitance of the test capacitor is calculated as:

$$Cdut = (Ivdd0 + Ivdd1 - Ivdd2)/(2 \times Vdd \times f)$$

wherein Cdut is the capacitance of the test capacitor, Ivdd0, Ivdd1, and Ivdd2 are the first, the second, and the third average charging currents, respectively, Vdd is a power supply voltage for charging the test capacitor and the first and the second parasitic capacitors, and f is a frequency of the plurality of clock cycles.

18. The method of claim 15 further comprising discharging the test capacitor after each of the first charging and the second charging, wherein the non-overlay clock-cycle signals are applied to the first PMOS transistor and the first NMOS transistor during discharging the test capacitor.

19. The method of claim 18 further comprising applying non-overlay clock-cycle signals to gates of a second PMOS transistor and a second NMOS transistor, with one end of the test capacitor connected to drains of the second PMOS transistor and the second NMOS transistor, wherein the non-overlay clock-cycle signals are configured to turn on at most one of the second PMOS transistor and the second NMOS transistor.

* * * * *